United States Patent
Biebersdorf et al.

(10) Patent No.: US 10,396,251 B2
(45) Date of Patent: *Aug. 27, 2019

(54) LIGHT-EMITTING DIODE INCLUDING A PLURALITY OF LUMINESCENT REGIONS

(71) Applicant: OSRAM GmbH, Munich (DE)

(72) Inventors: Andreas Biebersdorf, Regensburg (DE); Florian Boesl, Regensburg (DE); Krister Bergenek, Regensburg (DE); Ralph Wirth, Lappersdorf (DE)

(73) Assignee: OSRAM GMBH, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/641,250

(22) Filed: Jul. 4, 2017

(65) Prior Publication Data

US 2017/0301830 A1  Oct. 19, 2017

Related U.S. Application Data

(63) Continuation of application No. 14/649,564, filed as application No. PCT/EP2013/075397 on Dec. 3, 2013, now Pat. No. 9,735,321.

(30) Foreign Application Priority Data

Dec. 6, 2012 (DE) .................. 10 2012 222 475

(51) Int. Cl.
  *H01L 33/50* (2010.01)
(52) U.S. Cl.
  CPC .......... *H01L 33/502* (2013.01); *H01L 33/504* (2013.01); *H01L 33/505* (2013.01); *H01L 33/508* (2013.01)

(58) Field of Classification Search
  CPC ........... H01L 33/50–508; H01L 33/505; H01L 33/504
  See application file for complete search history.

(56) References Cited

U.S. PATENT DOCUMENTS

| 9,735,321 | B2* | 8/2017 | Biebersdorf | .......... H01L 33/502 |
| 2003/0144414 | A1* | 7/2003 | Bogner | .................... C08K 5/13 |
|  |  |  |  | 524/714 |
| 2008/0023712 | A1* | 1/2008 | Mueller | .................. C04B 35/01 |
|  |  |  |  | 257/98 |
| 2008/0048200 | A1* | 2/2008 | Mueller | .................. B29C 41/14 |
|  |  |  |  | 257/98 |

(Continued)

FOREIGN PATENT DOCUMENTS

WO  2007080555 A1  7/2007

OTHER PUBLICATIONS

International Search Report based on application No. PCT/EP2013/075397 (5 pages) dated Feb. 10, 2014 (for reference purpose only).

*Primary Examiner* — Changhyun Yi
(74) *Attorney, Agent, or Firm* — Viering Jentschura & Partner MBB

(57) ABSTRACT

Various embodiments may relate to A light-emitting diode, including an LED chip having at least one emitter surface for emitting primary light, and a plurality of luminescent regions, which are connected optically downstream from the at least one emitter surface. At least one harder one of the luminescent regions is embedded in another, softer one of the luminescent regions.

20 Claims, 3 Drawing Sheets

(56) References Cited

U.S. PATENT DOCUMENTS

2010/0148200 A1* 6/2010 Lai ................... H01L 33/508
                                                    257/98
2011/0019707 A1* 1/2011 Sato .................. H01L 33/504
                                                   372/45.01

* cited by examiner

LIGHT-EMITTING DIODE INCLUDING A PLURALITY OF LUMINESCENT REGIONS

RELATED APPLICATIONS

The present application is a continuation application of U.S. application Ser. No. 14/649,564, filed on Jun. 4, 2015 and entitled "LIGHT-EMITTING DIODE INCLUDING A PLURALITY OF LUMINESCENT REGIONS", which is a national stage entry according to 35 U.S.C. § 371 of PCT application No.: PCT/EP2013/075397 filed on Dec. 3, 2013, which claims priority from German application No.: 10 2012 222 475.0 filed on Dec. 6, 2012, all of which are incorporated herein by reference in their entirety.

TECHNICAL FIELD

Various embodiments may relate to a light-emitting diode, including an LED chip having at least one emitter surface for emitting primary light and including a plurality of luminescent regions, which are connected optically downstream from the at least one emitter surface. Various embodiments are applicable in particular to conversion light-emitting diodes, in particular to surface emitting light-emitting diodes, for example, perpendicularly emitting so-called top LEDs.

BACKGROUND

Warm white light is typically generated in that primary light emitted from an LED chip is at least partially converted into light of another wavelength by at least one phosphor, and the various fractions of light of different colors which are thus generated have a warm white total colorimetric locus. For example, blue primary light may be at least partially converted into red light by a "red" colorant and may be at least partially converted into green light by a "green" colorant. The resulting mixed light is red-green-blue or white, wherein a warm white color tone can be achieved, for example, by way of a high red fraction or by way of an additional wave conversion into a yellow or orange light.

However, in addition to the Stokes heat, still other losses also occur during the wavelength conversion. The phosphor can thus be embedded as a filler material (for example, powder) in a light-transmissive matrix material (for example, silicone). However, this may be less efficient, since the light power can be substantially reduced by the matrix material. An improvement of the efficiency is caused by so-called "local full conversion". In this case, the green and/or yellow color fraction is generated by a ceramic lamina, which is very efficient. However, there are currently no ceramic laminae which emit red light. For the red color fraction, as has resulted from internal experiments which have not yet been published, a hole can be created in the ceramic lamina and filled with a mixture of silicone and red colorant. For suitable colorimetric loci, however, this hole must be so large that the ceramic lamina only still has a small edge. However, this causes worse stability of the ceramic lamina, and a large amount of material is additionally discarded during the production.

SUMMARY

Various embodiments provide a light-emitting diode, including an LED chip having at least one emitter surface for emitting primary light and having a plurality of luminescent regions, which are connected optically downstream from the at least one emitter surface, wherein at least one harder one of the luminescent regions is embedded in another, softer one of the luminescent regions.

This results in the advantage that the (at least one) harder luminescent region does not have to be processed to accommodate the softer luminescent region. The harder luminescent region is therefore no longer structurally weakened and is additionally producible more easily and cost-effectively. The harder luminescent region can thus also be handled more easily, for example, can be suctioned on.

The fact that the (at least one) harder luminescent region is embedded in the softer luminescent region means in particular that the softer luminescent region consists of a material which is at least initially (during the production) free-flowing, which is in particular curable. The harder luminescent region is thus tightly enclosed. It is thus a refinement that the softer luminescent region consists of or has been produced from a free-flowing material.

The harder luminescent region may be completely embedded in the softer luminescent region and thus enclosed on all sides thereby. The harder luminescent region may alternatively also be embedded only partially in the softer luminescent region and thus only be enclosed partially, for example, only laterally thereby.

The light-emitting diode may include one or more harder luminescent regions. In the case of a plurality of luminescent regions, they may be constructed identically, in particular may have an identical shape, size, and/or material, or at least two of the plurality of harder luminescent regions may differ, for example, with regard to their shape, their size, and/or their material, for example, including the color of the light emitted therefrom.

In various embodiments, the harder luminescent region consists of a hard material. A hard material can be understood in particular as a material which is practically deformable only elastically (not plastically).

In various embodiments, the light-emitting diode includes one or more luminescent regions in the form of laminae.

In various embodiments, at least one harder one of the luminescent regions consists of ceramic. Such a ceramic is used as a phosphor ("luminescent ceramic") and enables high-efficiency wavelength conversion. Such luminescent ceramics are known in principle and do not have to be described in greater detail here.

In various embodiments the ceramic consists of LuAG: Ce, YAG:Ce (both optionally with dopant Gd, Sc, and/or Ga), or (Sr, Ba)SiON:Eu. Such a ceramic may be used in particular for generating a green to yellow secondary light.

In various embodiments, the softer one of the luminescent regions includes a matrix material made of plastic, which is admixed with at least one phosphor as a filler material. The plastic is preferably a free-flowing or viscous plastic for producing the light-emitting diode.

The plastic may include in particular silicone, epoxy resin, and/or at least one thermoplastic, in particular also a poly blend thereof.

The phosphor may be in particular a red or orange phosphor.

A luminescent ceramic lamina which is embedded in silicone filled with red phosphor is particularly preferred.

In various embodiments, the luminescent regions are arranged adjacent to one another in a light path of the primary light. Interactions of the luminescent regions are thus reduced.

In various embodiments, the luminescent regions represent regions of a luminescent lamina and cover an emitter surface of the LED chip. The LED chip may be a surface-emitting LED chip for this purpose in particular. Together with the embodiment that the luminescent regions are arranged adjacent to one another in a light path of the primary light, this can mean in particular that different luminescent regions are arranged adjacent to one another, i.e., are applied "laterally separated".

In various embodiments, the at least one harder one of the luminescent regions is laterally enclosed by the other, softer one of the luminescent regions. The luminescent lamina may thus be applied particularly simply. The softer one of the luminescent regions may laterally enclose one or more harder luminescent regions.

In various embodiments, the harder one of the luminescent regions has the basic form of a circular disk.

In various embodiments, the primary light is blue light, a harder one of the luminescent regions converts the blue primary light at least partially into green to yellow light and the softer one of the luminescent regions converts the blue primary light at least partially into red light, for example, depending on which red phosphor is used. An RGB color mixture can thus be achieved. However, still further and/or other phosphors can fundamentally also be used. Thus, further phosphors can additionally be used (for example, as the harder luminescent region or as filler of the softer luminescent region), for example, a yellow, an orange, and/or an amber phosphor. Additionally or alternatively to the green luminescent ceramic, a luminescent ceramic which emits light of another wavelength may also be used.

In various embodiments, the softer one of the luminescent regions has been produced by a printing method. The printing method may include, for example, screen printing or template printing, in particular via at least one luminescent ceramic body (preferably luminescent ceramic lamina).

In various embodiments, the softer one of the luminescent regions has been produced by a casting method. The casting method may include in particular overmolding or injection molding of at least one luminescent ceramic body (preferably luminescent ceramic lamina).

Various embodiments further provide a method for producing the light-emitting diode as disclosed above.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawings that show, by way of illustration, specific details and aspects of this disclosure in which the invention may be practiced.

Figure 1:
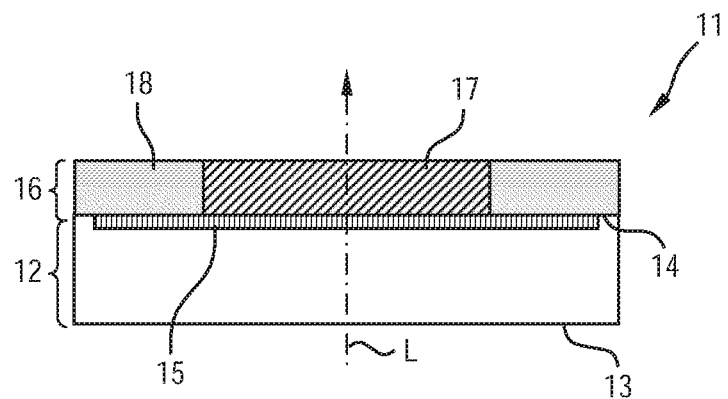
FIG. 1 shows a sectional illustration in a side view of a light-emitting diode according to various embodiments.

FIG. 1 shows a sectional illustration in a side view of a light-emitting diode 11 having an LED chip 12, which has a rear support surface 13 and a front side 14 having an emitter surface 15, which emits primary light forward or upward (top LED). The LED chip 12 thus emits into a front half-space. The primary light may be blue light, for example.

Figure 2:
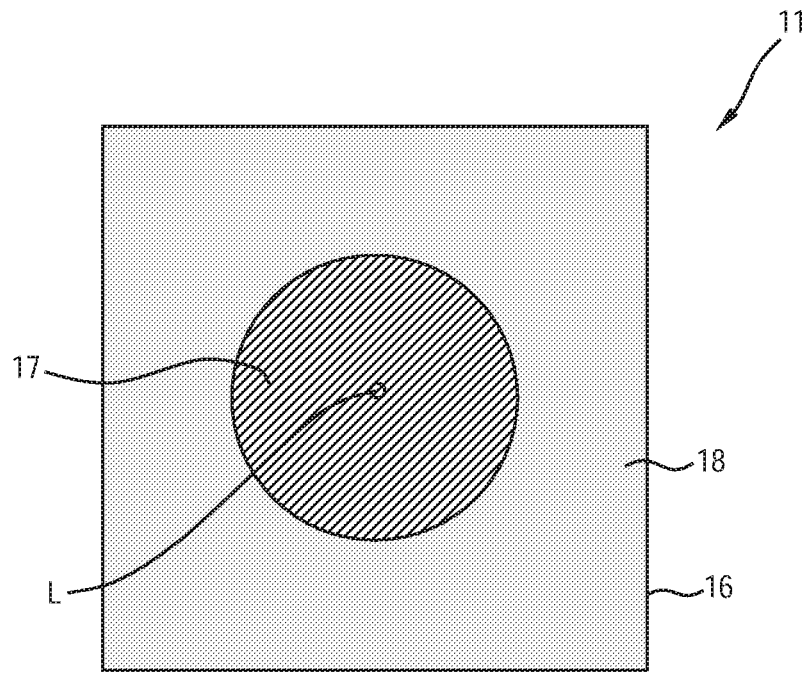
FIG. 2 shows the light-emitting diode according to various embodiments in a top view.

A luminescent lamina 16, which completely covers the emitter surface 15, rests on the front side 14. As is also apparent in a top view from FIG. 2, the luminescent lamina 16 has two luminescent regions, namely a circular first luminescent region 17 made of ceramic phosphor and a second luminescent region 18 made of plastic matrix material, in particular silicone, filled with phosphor powder. The two luminescent regions 17 and 18 have an at least essentially equal height. The first (harder) luminescent region 17 is arranged in the middle in relation to a longitudinal axis L of the light-emitting diode 11, while the second (softer) luminescent region 18 laterally encloses the first luminescent region 17. The first luminescent region 17 is therefore laterally embedded in the second luminescent region 18.

In operation of the LED chip 12, primary light emitted from the emitter surface 15 is radiated both into the first luminescent region 17 and converted therein, for example, at least partially into green light and also radiated into the second luminescent region 18 and converted therein, for example, at least partially into red light. The luminescent regions 17, 18 are thus connected optically downstream from the emitter surface 15 and arranged adjacent to one another in a light path of the primary light. A red-green-blue or warm white mixed light is thus emitted overall at high efficiency from the luminescent lamina 16. Due to the lateral separation of the luminescent regions 17, 18, the mutual influence thereof is kept low.

Figure 3A:
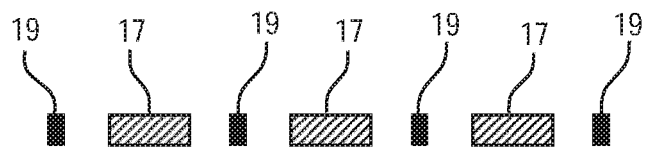
FIGS. 3A-3B show a sequence of a first method for producing a luminescent lamina of the light-emitting diode according to various embodiments.

FIG. 3A shows a step of a first method for producing the luminescent lamina 16 by a printing method. In this step, a plurality of prefinished first luminescent regions 17 in the form of luminescent ceramic laminae in the shape of circular disks are placed in a mask 19.

In a following step, the mask 19 having the first luminescent regions 17 located therein is printed, specifically using the still viscous material of the second luminescent region 18. The material of the second luminescent region 18 is thus filled in the free lateral intermediate spaces between the mask 19 and the first luminescent regions 17.

Figure 3B:
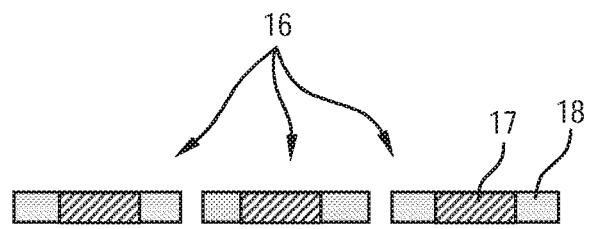

After curing of the material of the second luminescent region 18, the mask 19 is removed, whereby the finished luminescent laminae 16 are isolated, as shown in FIG. 3B.

The luminescent laminae 16 can thereafter be applied to the LED chip 12, for example, glued on.

Figure 4:
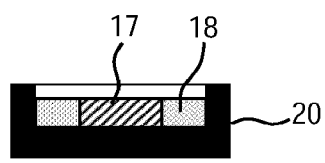
FIG. 4 shows a sequence of a second method for producing a luminescent lamina of the light-emitting diode according to various embodiments.

FIG. 4 shows a step of a second method for producing the luminescent lamina 16, specifically by a casting method.

During the casting method, the first luminescent region 17 is placed in a casting mold 19 and then embedded using the material of the second luminescent region 18, here: up to an upper edge of the first luminescent region 17, but not covering the emitter surface 15.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SIGNS 11 light-emitting diode
12 LED chip
13 rear support surface
14 front side
15 emitter surface
16 luminescent lamina
17 first luminescent region
18 second luminescent region
19 mask
20 casting mold
L longitudinal axis

What is claimed is:

1. A light-emitting diode, comprising:
an LED chip comprising at least one emitter surface for emitting primary light, and
a plurality of luminescent regions, which are connected optically downstream from the at least one emitter surface,
wherein a first luminescent region of the luminescent regions is embedded in a second luminescent region of the luminescent regions; wherein the first luminescent region comprises a harder base material as compared to a base material of the second luminescent region; wherein the first luminescent region and the second luminescent region contact and are flush with a front side of the LED chip; wherein the luminescent regions contact one another and are laterally adjacent to one another in a light path of the primary light.

2. The light-emitting diode as claimed in claim 1, wherein the first luminescent region consists of ceramic.

3. The light-emitting diode as claimed claim 1, wherein the base material of the second luminescent region comprises a matrix material made of plastic, which is admixed with at least one phosphor as a filler material.

4. The light-emitting diode as claimed in claim 1, wherein the luminescent regions represent regions of a luminescent lamina and contact an emitter surface of the LED chip.

5. The light-emitting diode as claimed in claim 4, wherein the first luminescent region is laterally enclosed by the second luminescent region.

6. The light-emitting diode as claimed in claim 1, wherein the first luminescent region has a basic form of a circular disk.

7. The light-emitting diode as claimed in claim 1, wherein the primary light is blue light, the first luminescent region converts the blue primary light at least partially into green to yellow light and the second luminescent region converts the blue primary light at least partially into red light.

8. The light-emitting diode as claimed in claim 1, wherein the second luminescent region has been produced by a printing method.

9. The light-emitting diode according to claim 1, wherein the second luminescent region has been produced by a casting method.

10. The light-emitting diode according to claim 1, wherein the first luminescent region is disposed on only a middle portion of the front side of the LED.

11. The light-emitting diode according to claim 10, wherein the second luminescent region is laterally disposed around the first luminescent region.

12. The light-emitting diode according to claim 11, wherein the first luminescent region is substantially circular.

13. The light-emitting diode according to claim 1, wherein the first luminescent region and the second luminescent region are substantially a same height.

14. The light-emitting diode according to claim 1, wherein the base material of the first luminescent region comprises ceramic.

15. A light-emitting diode, comprising:
an LED chip comprising at least one emitter surface for emitting primary light, and
a ceramic lamina comprising a plurality of luminescent regions, which are connected optically downstream from the at least one emitter surface,
wherein a first luminescent region of the luminescent regions is embedded in a second luminescent region of the luminescent regions; wherein the first luminescent region comprises a harder base material as compared to a base material of the second luminescent region; and wherein the first luminescent region and the second luminescent region contact an emitting side of the LED chip, wherein the LED is a top emitting LED.

16. The light-emitting diode as claimed in claim 15, wherein the luminescent regions contact one another and are arranged laterally adjacent to one another in a light path of the primary light; wherein the luminescent regions are flush with the front side of the LED chip.

17. The light emitting diode as claimed in claim 15, wherein the emitter surface defines a plane, and wherein the ceramic lamina is located only on a side of the emitter surface facing away from the LED chip where the ceramic lamina is also parallel with the LED chip.

18. The light-emitting diode as claimed in claim 15, wherein the ceramic lamina comprises a red phosphor, a yellow phosphor, an orange phosphor, an amber phosphor, or combinations thereof.

19. A light-emitting diode, comprising:
an LED chip comprising at least one emitter surface for emitting primary light, and
a plurality of luminescent regions, which are connected optically downstream from the at least one emitter surface,
wherein a first luminescent region of the luminescent regions is directly embedded in a second luminescent region of the luminescent regions; wherein the first luminescent region comprises a harder base material as compared to a base material of the second luminescent region; wherein the first luminescent region and the second luminescent region contact a front side of the LED; and wherein the emitter surface defines a plane, and wherein the luminescent regions are located only on a side of the emitter surface facing away from the LED chip.

20. The light-emitting diode as claimed in claim 19, wherein the luminescent regions contact one another and are laterally adjacent to one another in a light path of the primary light; wherein the luminescent regions are flush with the front side of the LED chip.

* * * * *